US008982608B2

United States Patent
Kajigaya

(10) Patent No.: US 8,982,608 B2
(45) Date of Patent: *Mar. 17, 2015

(54) SEMICONDUCTOR DEVICE AND DATA PROCESSING SYSTEM

(71) Applicant: PS4 Luxco S.a.r.l., Luxembourg (LU)

(72) Inventor: Kazuhiko Kajigaya, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

This patent is subject to a terminal disclaimer.

(21) Appl. No.: 13/864,329

(22) Filed: Apr. 17, 2013

(65) Prior Publication Data

US 2013/0229857 A1     Sep. 5, 2013

Related U.S. Application Data

(63) Continuation of application No. 13/006,109, filed on Jan. 13, 2011, now Pat. No. 8,441,840.

(30) Foreign Application Priority Data

Jan. 15, 2010   (JP) .................................. 2010-007460

(51) Int. Cl.
  *G11C 11/24*   (2006.01)
  *G11C 8/12*    (2006.01)
  (Continued)

(52) U.S. Cl.
  CPC   *G11C 11/24* (2013.01); *G11C 8/12* (2013.01); *G11C 11/404* (2013.01); *G11C 11/4091* (2013.01); *G11C 2211/4016* (2013.01)
  USPC . 365/149; 365/104; 365/185.22; 365/185.23; 365/189.09; 365/230.08; 365/207

(58) Field of Classification Search
  USPC ............... 365/149, 104, 189.09, 207, 230.08, 365/185.22, 185.23
  See application file for complete search history.

(56) References Cited

U.S. PATENT DOCUMENTS 6,501,672 B1 * 12/2002 Sekiguchi et al. .............. 365/72
7,082,073 B2    7/2006 Casper
7,643,347 B2 *  1/2010 Abiko et al. ............. 365/185.17
(Continued)

FOREIGN PATENT DOCUMENTS

JP       8-22693 A        1/1996
WO   2006/060249 A1     6/2006

OTHER PUBLICATIONS

Tadaaki Yamauchi,et al.,"High-Perfomance Embedded SOI DRAM Architecutre for the Low-Power Supply", IEEE Journal of Solid-State Circuits, Aug. 2000, pp. 1169-1178, vol. 35, No. 8.
(Continued)

*Primary Examiner* — Pho M Luu
(74) *Attorney, Agent, or Firm* — Sughrue Mion, PLLC

(57) ABSTRACT

A semiconductor device having a memory cell including a capacitor and a select transistor with a floating body structure, a bit line connected to the select transistor, a bit line control circuit, and a sense amplifier amplifying a signal read out from the memory cell. The bit line control circuit sets the bit line to a first potential during a non-access period of the memory cell, and thereafter sets the bit line to a second potential during an access period of the memory cell, so that the data retention time can be prolonged by reducing leak current at a data storage node of the memory cell so that an average consumption current for the data retention can be reduced.

24 Claims, 16 Drawing Sheets

(51) Int. Cl.
*G11C 11/404* (2006.01)
*G11C 11/4091* (2006.01)

(56) References Cited

U.S. PATENT DOCUMENTS

| | | | |
|---|---|---|---|
| 7,715,246 B1* | 5/2010 | Kim | 365/189.14 |
| 7,936,321 B2* | 5/2011 | Park | 345/76 |
| 7,936,621 B2* | 5/2011 | Okuda et al. | 365/194 |
| 8,014,186 B2* | 9/2011 | Kimura et al. | 365/145 |
| 8,228,707 B2* | 7/2012 | Nishimura et al. | 365/145 |
| 8,441,840 B2* | 5/2013 | Kajigaya | 365/149 |
| 2008/0291762 A1 | 11/2008 | Kajigaya | |

OTHER PUBLICATIONS

Notice of Allowance issued Jan. 18, 2013 in parent U.S. Appl. No. 13/006,109.

Non-final Office Action issued Aug. 27, 2012 in parent U.S. Appl. No. 13/006,109.

\* cited by examiner

SEMICONDUCTOR DEVICE AND DATA PROCESSING SYSTEM

This application is a Continuation Application of U.S. application Ser. No. 13/006,109 filed Jan. 13, 2011, now issued as U.S. Pat. No. 8,441,840, on May 14, 2013, which claims priority from Japanese Patent Application No. 2010-007460 filed Jan. 15, 2010, the disclosures of which are incorporated herein by reference in their entirety.

BACKGROUND OF THE INVENTION

1. Field of the Invention

The present invention relates to a semiconductor device in which data stored in a memory cell is read out to a bit line and amplified by a sense amplifier, and particularly relates to a semiconductor device employing a memory cell including a select transistor with a floating body structure.

2. Description of Related Art

In a semiconductor memory device such as DRAM (Dynamic Random Access Memory), 1T1C type memory cells each including a capacitor and a select transistor are often used. Generally, in this type of memory cells, a PN junction is formed between a storage electrode of the capacitor and a body of the select transistor. It is known that leak current at the storage electrode of the memory cell increases in proportion to electric field intensity at the PN junction between the body and the storage electrode of the capacitor. Thus, in order to reduce the leak current of the memory cell, it is required to reduce the electric field intensity applied to the PN junction. Here, the potential of the PN junction in a conventional memory cell will be explained as a first related technique with reference to FIG. 14. FIG. 14 shows a schematic cross sectional view of the memory cell using the select transistor with a bulk type MOS structure, in which an N-type impurity layer 301 (source region) connected to a bit line BL and an N-type impurity layer 302 (drain region) connected to a storage electrode 306 of a capacitor Cs are formed on an upper region of a P-type silicon substrate 300, and an element isolation insulating film 303 is formed around the impurity layers 301 and 302. Over the P-type silicon substrate 300 functioning as the body of the select transistor, there is formed a gate electrode 305 connected to the word line WL via a gate dielectric film 304. Here, in the capacitor Cs, a plate voltage VPLT is applied to a plate electrode 307, the storage electrode 306 maintains a voltage VSN, and a substrate voltage VBB is applied to the P-type silicon substrate 300. A potential state in the select transistor in this case is shown in a graph of FIG. 15, in which the potential is rapidly changes at a position of the PN junction formed along a path (having relative positions on a horizontal axis) from the drain to the P-type silicon substrate 30. A potential difference occurring at this point in the PN junction is VSN−VBB+Vbi (Vbi is a built-in potential in a thermal equilibrium state). In the example of FIG. 15, it is assumed that VSN=1V, VBB=−0.5 and Vbi=0.6V, and the potential difference in case where the memory cell stores HIGH data is about 2.1V. The electric field intensity applied to the PN junction increases in proportion to the potential difference occurring in the PN junction and densities of P- and N-type impurities in a portion of the PN junction.

A second related technique for reducing the electric field intensity at the above PN junction in the memory cell has been proposed. For example, Patent References 1 and 2 disclose a technique for reducing the electric field applied to the PN junction by reducing the plate voltage VPLT applied to the capacitor Cs of the memory cell and reducing the voltage VSN of the storage electrode 306 using capacitance coupling during a period when a refresh operation is not performed in a self refresh mode (data retention mode) of the DRAM. For example, in a case where the voltage VSN of the storage electrode 306 is 1V when HIGH data is stored in the memory cell and is 0V when LOW data is stored therein, the plate voltage VPLT is usually set to 0.5V as an intermediate voltage. Then, the reduction of the electric field applied to the PN junction can be achieved by reducing the plate voltage VPLT. The potential state of the select transistor in this case is shown in a graph of FIG. 16, in which both voltage values including VSN=0.5V for the HIGH data and VSN=−0.5V for the LOW data decrease in comparison with FIG. 15, and the potential occurring in the PN junction is reduced from 2.1V (the first related technique) to 1.6V so as to reduce the leak current. In this example, even if the leak current occurs when storing the LOW data, the voltage VSN decreases and destruction of the stored data in the memory cell can be prevented, and thus it is not particularly necessary to consider the electric field intensity.

[Patent Reference 1] Japanese Patent Application Laid-open No. H8-22693

[Patent Reference 2] International Publication. No. WO2006-060249 (corresponding to U.S. Pat. No. 7,082,073)

[Non-Patent Reference 1] T. Yamauchi et al., "High-Performance Embedded SOI DRAM Architecture for the Low-Power Supply," IEEE J. Solid-State Circuits, vol. 35, pp. 1169-1178, August 2000.

However, when employing the above conventional technique, the plate voltage VPLT needs to be returned to 0.5V for all memory cells before starting operations of sensing or refreshing for the bit line BL. Therefore, a restore time is necessary and consumption current increases, and thus a problem arises in that the technique cannot be adapted to a normal operation mode (external access mode) in which sensing operations are frequently repeated.

Meanwhile, Non-Patent Reference 1 discloses a technique capable of reducing the voltage VSN of the storage electrode 306 in a data retention state by driving the plate voltage VPLT with a pulse signal in a write operation of the memory cell (capacitor) using a floating body type select transistor with an SOI structure. For example, the voltage VSN of the storage electrode 306 is 0.8V when the memory cell stores the HIGH data and is −0.6V when the memory cell stores the LOW data. However, the Non-Patent Reference 1 discloses that the potential of the bit line BL is set to 0.4V in a precharge operation. Therefore, when the memory cell stores the LOW data, strong electric field is applied to the PN junction between the body and the bit line BL, and thus a problem arises in that the leak current increases when the LOW data is stored in the memory cell.

SUMMARY

The present invention seeks to solve one or more of the above problems, or to improve upon those problems at least in part.

One of aspects of the invention is a semiconductor device comprising: a memory cell in which a capacitor storing data as charge and a select transistor having a floating body in an electrically floating state formed between a source region and a drain region are connected in series; a bit line connected to the select transistor; a bit line control circuit setting the bit line to a first potential during a non-access period of the memory cell in a data retention state and setting the bit line being set to the first potential to a second potential different from the first potential during an access period of the memory cell in a non-conductive state of the select transistor; and a sense amplifier amplifying a signal read out from the memory cell through the bit line being set to the second potential when the select transistor is controlled to be conductive.

In the semiconductor device of the invention, when employing the memory cell using the select transistor with the floating body structure, leak current in the memory cell is suppressed by appropriately controlling the potential of the bit line. Specifically, when stored data in, for example, a 1T1C (one transistor and one capacitor) type memory cell with the floating body structure, the bit line is set to the first potential in the data retention state of the memory cell (precharge period, i.e. standby period as the non-access period of the memory cell), subsequently the bit line is set (shifted) to the second potential from the first potential before controlling the select transistor to be conductive in an access to the memory cell, and thereafter amplifying operation of the sense amplifier is performed by controlling the select transistor to be conductive. At this point, by appropriately setting the first potential, electric field intensities at PN junctions formed between the floating body and source/drain of the select transistor can be respectively minimized regardless whether the memory cell stores data "1" or "0". Meanwhile, the second potential allows an operating point of the sense amplifier to be set. Accordingly, the optimal operating point can be kept for the sense amplifier to sense the signal, the leak current proportional to the electric field intensity at the above PN junction can be suppressed in the memory cell, and data retention time during the standby period can be prolonged so as to decrease consumption current.

The present invention can be applied to a data processing system comprising the semiconductor device and a controller connected to the semiconductor device through a bus. The controller processes data stored in the semiconductor device and controls operations of the system as a whole and an operation of the semiconductor device.

As described above, according to the present invention, in the semiconductor device such as DRAM, by employing the 1T1C type memory cell with the floating body structure, the potential occurring at the floating body can be controlled based on a lower voltage of the bit line voltage and the voltage at the storage electrode of the capacitor. Thereby, the potential of the bit line can be controlled so that when the memory cell (capacitor) stores HIGH data, the electric field intensity at the PN junction between the floating body and the storage electrode can be reduced, and when the memory cell (capacitor) stores LOW data, the electric field intensity at the PN junction between the floating body and the bit line can be reduced. In this case, if the bit line is set to the first potential during the precharge period and thereafter the bit line is set to the second potential before the amplifying operation of the sense amplifier, the potential of the bit line during the data retention period can be set optimally independently of the operating point of the sense amplifier. Accordingly, since the data retention time can be prolonged by reducing the leak current at the data storage node of the memory cell, an average consumption current for the data retention can be reduced by setting a long refresh interval. Further, when the semiconductor device operates according to an open page policy or when the same page is controlled to open and close repeatedly in a long time, the average consumption current in the operation can be reduced by setting the long refresh interval as described above.

BRIEF DESCRIPTION OF THE DRAWINGS

The above featured and advantages of the present invention will be more apparent from the following description of certain preferred embodiments taken in conjunction with the accompanying drawings, in which.

DETAILED DESCRIPTION OF THE PREFERRED EMBODIMENTS

A typical example of a technical idea solving the problems of the present invention will be shown below. However, It goes without saying that the present invention is not limited to the example of the technical idea and should be construed based on the disclosure of the claims.

An example of the technical idea of the invention is applied to a semiconductor device provided with memory cells each including a select transistor with a floating body structure such as a MOS transistor with an SOI structure, a MOS transistor with a Fin structure, and a MOS transistor with a surround gate structure. When reading data stored in one of such memory cells to a bit line, the bit line is set to a first potential so that electric field intensity at a PN junction of the select transistor is minimized during a precharge period (a standby period as a non-access period of the memory cell), and the bit line is set to a second potential corresponding to an optimal operating point for sensing by a sense amplifier before turning on the select transistor with an access to the memory cell. Thus, the potential of the bit line is shifted by changing it from first potential to the second potential, and in this state, the potential is sensed and amplified by the sense amplifier. By independently controlling the first and second potentials, the leak current of the memory cell caused by the electric field intensity at the PN junction of the select transistor can be suppressed, thereby achieving effects of an increase in data retention time and a reduction of current consumption.

Preferred embodiments of the invention will be described in detail below with reference to accompanying drawings. In the following embodiments, the present invention is applied to DRAM (Dynamic Random Access Memory) as an example of the semiconductor device. First, basic configuration and operation in the DRAM of the embodiments will be described with reference to FIGS. 1 to 7.

Figure 1:
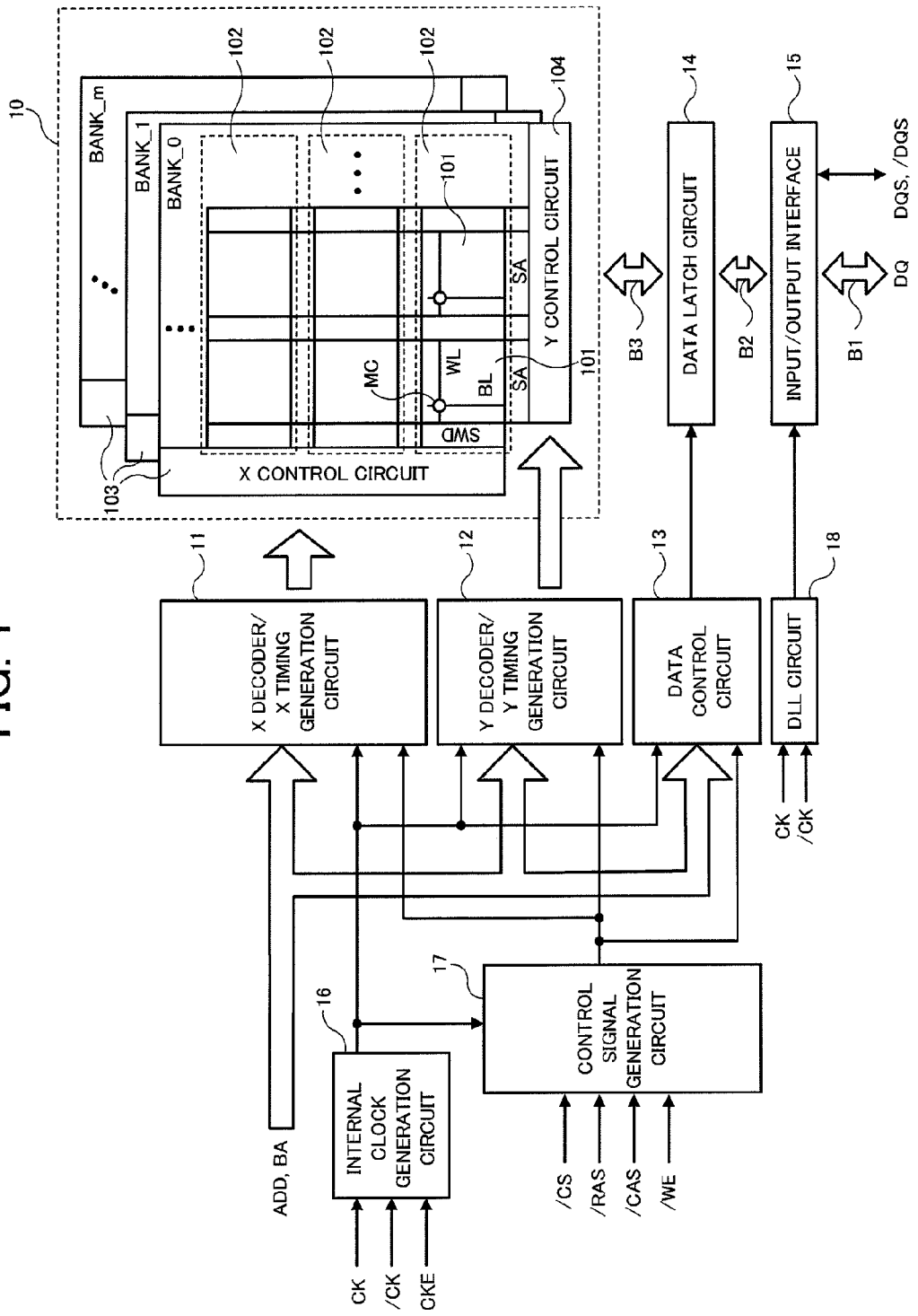
FIG. 1 is a block diagram showing an entire configuration of DRAM of the embodiment.

FIG. 1 is a block diagram showing an entire configuration of the DRAM of an embodiment. The Dram shown in FIG. 1 includes a memory cell array 10, X decoder/X timing generation circuit 11, Y decoder/Y timing generation circuit 12, a data control circuit 13, a data latch circuit 14, an input/output interface 15, an internal clock generation circuit 16, a control signal generation circuit 17, and a DLL (Delay Locked Loop) circuit 18.

The memory cell array 10 is divided into a plurality of memory mats 101 each including a plurality of memory cells MC formed at intersections of a plurality of word lines WL and a plurality of bit lines BL. A predetermined number of memory mats 101 aligned in a word line extending direction form a memory mat row 102, and a plurality of memory mat rows 102 form a bank (BANK). In the example of FIG. 1, m+1 (m is an integer) banks (BANK_0 to BANK_m) are provided. Each bank is provided with an X control circuit 103 and a Y control circuit 104. Further, around each memory mat 101, there are a sense amplifier region (SA) including a plurality of sense amplifiers as describe later, and a sub-word driver region (SWD) including a plurality of sub-word driver circuits driving the word lines WL The memory cell array 10 is connected to the data latch circuit 14 via a bus B3 for data transfer. The data latch circuit 14 is connected to the input/output interface 15 via a bus B2 for data transfer. The input/output interface 15 inputs/outputs data (DQ) and data strobe signals DQS and /DQS from/to the outside via the bus B1 for data transfer. The data transfer through the buses B1, B2 and B3 is controlled by the data control circuit 13, and output timing of the input/output interface 15 is controlled by the DLL circuit 18 to which external clock signals CK and /CK are supplied. Further, the X decoder/X timing generation circuit 11 controls the X control circuit 103 of each bank, and the Y decoder/Y timing generation circuit 12 controls the Y control circuit 104 of each bank.

The internal clock generation circuit 16 generates internal clocks based on the external clock signals CK, /CK and a clock enable signal CKE, and supplies them to various parts of the DRAM. The control signal generation circuit 17 generates control signals based on an external chip select signal /CS, a row address strobe signal /RAS, a column address strobe signal /CAS, and a write enable signal /WE, and supplies them to various parts of the DRAM. In addition, an address ADD and a bank address BA are externally supplied to the X decoder/X timing generation circuit 11, the Y decoder/Y timing generation circuit 12 and the data control circuit 13.

Figure 2:
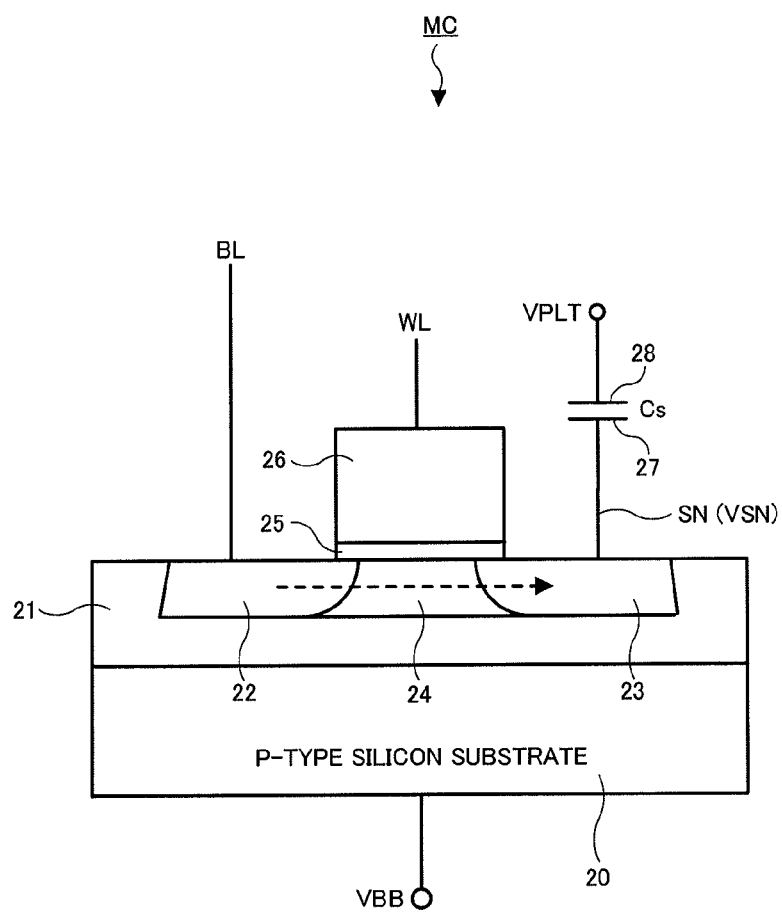
FIG. 2 is a schematic cross sectional view of a memory cell using a select transistor having a SOI type MOS structure.

Next, the structure of each memory cell MC in the DRAM of the embodiment will be described with reference to FIG. 2. FIG. 2 is a schematic cross sectional view of the memory cell MC using the select transistor with the SOI type MOS structure. In FIG. 2, a P-type silicon substrate 20 is applied with a substrate voltage VBB, and an element isolation insulating film 21 is formed thereon. On the element isolation insulating film 21, there are formed an N-type impurity layer (source region) 22 as a source, an N-type impurity layer (drain region) 23 as a drain, and a floating body 24 between the source and drain. One N-type impurity layer 22 is connected to a bit line BL on an upper layer, and the other N-type impurity layer 23 is connected to a storage electrode 27 as one electrode of a capacitor Cs via a data storage node SN. A plate electrode 28 as the other electrode of the capacitor Cs is opposed to the storage electrode 27 via a dielectric film, and is connected to a line of a plate voltage VPLT on an upper layer. Further, a gate electrode 26 connected to the word line WL is formed over the floating body 24 between the N-type impurity layers 22 and 23 via a gate dielectric film 25.

A structural feature of the select transistor shown in FIG. 2 is that regions of the source and drain (the N-type impurity layers 22 and 23) of the select transistor and the floating body 24 are separated from the P-type silicon substrate 20 via the element isolation insulating film 21. By this structure, the floating body 24 is in a floating state. A silicon layer having the N-type impurity layers 22, 23 and the floating body 24 on the element isolation insulating film 21 is formed, for example, with a thickness smaller than 50 mm, without being limited thereto. In this case, the floating body 24 acts in a fully depleted state, and a neutral region of P-type silicon does not exist therein. The select transistor with the floating body structure shown in FIG. 2 is referred to as "floating body type select transistor".

Figure 3:
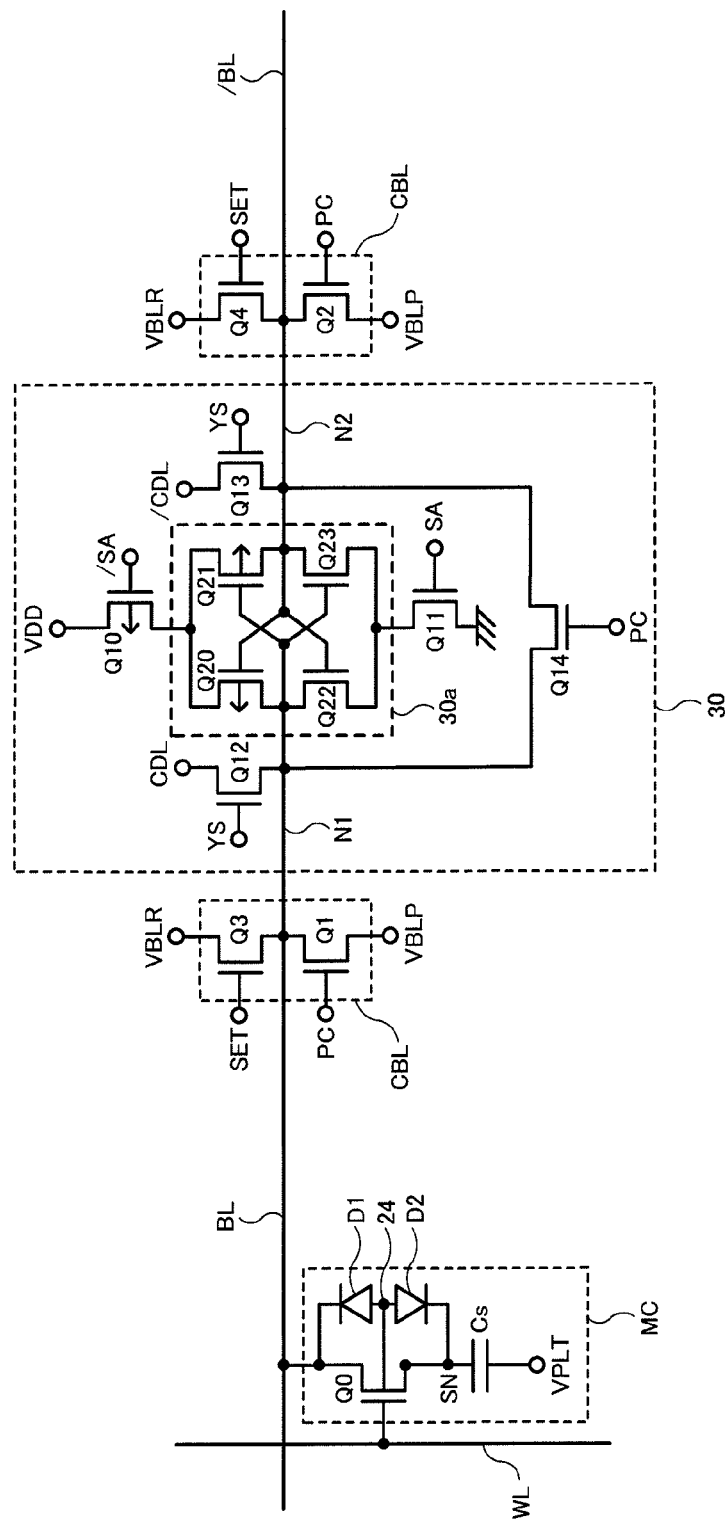
FIG. 3 is a diagram showing an example of a partial circuit configuration in a memory cell array of the DRAM of the embodiment.

In the following, configuration and operation of the memory cell array configured using the above floating body type select transistor in the DRAM of the embodiment will be described. FIG. 3 shows an example of a partial circuit configuration (memory mats 101 on both sides of one sense amplifier region SA) in the memory cell array of the DRAM of the embodiment. As shown in FIG. 3, the memory cell MC is formed at an intersection of the word line WL and the bit line BL. The memory cell MC is formed by series-connecting a floating body type select transistor (Hereinafter, referred to simply as "select transistor") Q0 and the capacitor Cs storing data of the memory cell MC as charge. The select transistor Q0 has a gate connected to the word line WL, a source connected to the bit line BL, and a drain connected to one electrode (the storage electrode 27 in FIG. 2) of the capacitor Cs. The plate voltage VPLT is applied to the other electrode (the plate electrode 28 in FIG. 2) of the capacitor Cs.

FIG. 3 shows a pair of diodes D1 and D2 as parasitic elements associated with the select transistor Q0. That is, the PN junction is formed between the floating body 24 and the N-type impurity layers 22 and 23 in the structure of FIG. 2, which functions as the diodes D1 and D2. One diode D1 is formed between the floating body 24 and the N-type impurity layer 22 (the bit line BL) as the source, and the other diode D2 is formed between the floating body 24 and the N-type impurity layer 23 (the data storage node SN) as the drain.

The sense amplifier 30 is connected to the respective bit lines BL and /BL, the memory cell MC is connected to the bit line BL, and the bit lines BL and /BL form a complementary bit line pair. The sense amplifier 30 senses and amplifiers a signal read out from the memory cell MC to the bit line BL and restores data to the memory cell MC. As shown in FIG. 3, the sense amplifier 30 is a dynamic latch type sense amplifier including a PMOS type transistor Q10, NMOS type transistors Q11, Q12, Q13, Q14, and a latch circuit 30a.

The latch circuit 30a of the sense amplifier 30 includes a pair of inverters which is composed of two PMOS type transistors Q20 and Q21 and two NMOS type transistors Q22 and Q23, and inputs and outputs of the pair of inverters are cross-coupled to each other. One bit line BL is connected to a node N1 of the latch circuit 30a and the other bit line /BL is connected to a node N2 of the latch circuit 30a. Further, transistors Q10 and Q11 function as power transistors connected to the latch circuit 30a. That is, the transistor Q10 supplies a power supply voltage VDD to sources of the transistors Q20 and Q21 in response to a sense amplifier drive signal /SA applied to its gate. The transistor Q11 supplies a grand potential VSS to sources of the transistors Q22 and Q23 in response to a sense amplifier drive signal SA applied to its gate.

The transistors Q12 and Q13 (the connection circuit of the invention) in the sense amplifier 30 receive read data sensed through the complementary bit line pair BL and /BL so as to output the read data to the outside, or receive write data for the memory cell MC from the outside so as to output the write data to the complementary bit line pair BL and /BL. That is, one transistor Q12 controls connection between the bit line BL (node N1) and a data line CDL in response to a select signal YS applied to its gate, and the other transistor Q13 controls connection between the bit line /BL (node N2) and a data line /CDL in response to the select signal YS applied to its gate. Further, the transistor Q14 in the sense amplifier 30 is connected between two nodes N1 and N2, and operates to allow the nodes N1 and N2 of both sides of the sense amplifier 30 to be at the same voltage (precharge voltage VBLP) in response to a precharge signal PC.

NMOS type transistors Q1 and Q3 connected to the node N1 and NMOS type transistors Q2 and Q4 connected to the node N2 are arranged around the sense amplifier 30. Among these, the transistors Q1 and Q2 (the first potential setting circuit of the invention) operate to supply the precharge voltage VBLP (the first potential of the invention) to the complementary bit line pair BL and /BL in response to the precharge signal PC applied to respective gates, in the data retention of the memory cell MC. Meanwhile, the transistors Q3 and Q4 (the second potential setting circuit of the invention) operate to set the complementary bit line pair BL and /BL to a predetermined reference voltage VBLR (the second potential of the invention) in response to a set signal SET applied to respective gates, before the read operation of the memory cell MC. Here, the transistors Q1 and Q3 form a bit line control circuit CBL. Similarly, the transistors Q2 and Q4 form a bit line control circuit CBL.

As described later, the reference voltage VBLR is approximately set to an intermediate voltage between the first voltage applied to the storage electrode 27 when the memory cell MC stores data "1" and the second voltage applied to the storage electrode 27 when the memory cell MC stores data "0". The precharge voltage VBLP is lower than the intermediate voltage and is set between the intermediate voltage and the second voltage.

Figure 4:
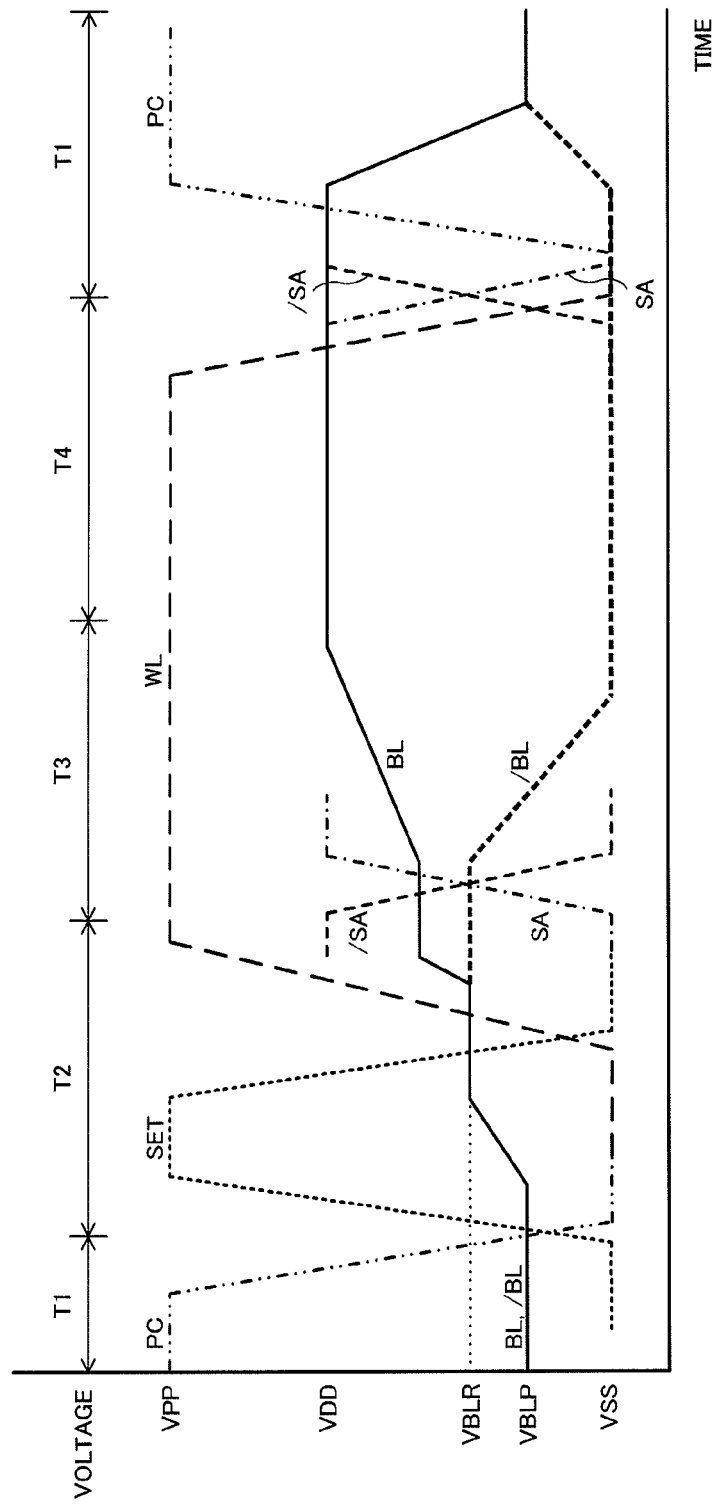
FIG. 4 is a diagram showing operation waveforms corresponding to a read operation and a restore operation for the memory cell in the circuit configuration of FIG. 3.

Next, operations of the DRAM of the embodiment will be described. FIG. 4 shows operation waveforms corresponding to a read operation and a restore operation for the memory cell MC in the circuit configuration of FIG. 3. As shown in an upper part of FIG. 4, an entire range of the operation waveforms is divided into a precharge period T1, a reading period T2, a sensing period T3 and a restore period (write period) T4. The precharge period T1 is a non-access period of the memory cell MC. The non-access period includes, for example, a self refresh mode in which the memory cell MC is refreshed periodically with a predetermined time interval using a well known timer in the semiconductor device during a period when the semiconductor device is not accessed from the outside, and also includes an internal standby period when the memory cell MC is not refreshed and the like. The periods T2 to T4 are included in an access period opposite to the non-access period. In FIG. 4, high level of the precharge signal PC, the set signal SET and the word line WL is a positive voltage VPP, while high level of the complementary bit line pair BL and /BL and the sense amplifier drive signals SA and /SA is the power supply voltage VDD. Low level of all these signals is the grand potential VSS. This is an example of settings of voltages. Further, in the later-described periods T2 to T4, it should be noted that accessing is performed in memory mats 101 on both sides of one sense amplifier region SA to be accessed. That is, the second potential setting circuit of the invention is controlled to be activated only for the memory mats to be accessed, and the second potential setting circuit associated with memory mats not to be accessed remains in a non-activated state.

First, during the precharge period T1, the precharge signal PC is initially in a state of being HIGH, and the complementary bit line pair BL and /BL have been both precharged to the precharge voltage VBLP. When moving to the reading period T2, the precharge signal PC is changed to LOW, and subsequently the set signal SET is changed from LOW to HIGH. Then, the complementary bit line pair BL and /BL is set to the reference voltage VBLR, and thereafter the set signal SET is returned to LOW. Next, the word line WL is driven to HIGH, HIGH data of the memory cell MC is read out, and the potential of the bit line BL rises from the reference voltage VBLR to a predetermined potential. At this point, the potential of the other bit line /BL for which the word line is not activated maintains the reference voltage VBLR so as to be used as an operating point of the sense amplifier 30. It is assumed that the HIGH data stored in the memory cell MC corresponds to data "1" (for example, high potential) and the LOW data stored in the memory cell MC corresponds to data "1" (for example, low potential).

Next, when moving to the sensing period T3, one sense amplifier drive signal SA is changed from LOW to HIGH, and the other sense amplifier drive signal /SA is changed from HIGH to LOW. Thereby, the sense amplifier 30 to which the power supply voltage VDD and the grand potential VSS are supplied via the transistors Q10 and Q11 is driven, the potential of one bit line BL is amplified to the power supply voltage VDD, and the potential of the other bit line /BL is amplified to the grand potential VSS. Then, when moving to the restore period (write period) T4, the signal voltage amplified by the sense amplifier 30 in the read operation is restored to the memory cell MC as charge of the capacitor Cs. Further, the complementary bit line pair BL and /BL is driven by write data in an external write operation, and the signal voltage at this point is written into the memory cell MC as charge of the capacitor Cs.

Next, when moving to the precharge period T1 again, the word line WL falls to LOW, one sense amplifier drive signal SA is changed to LOW, and the other sense amplifier drive signal /SA is changed to HIGH. Subsequently, the precharge signal PC is changed to HIGH, and the complementary bit line pair BL and /BL is precharged to the precharge voltage VBLP again.

Figure 5:
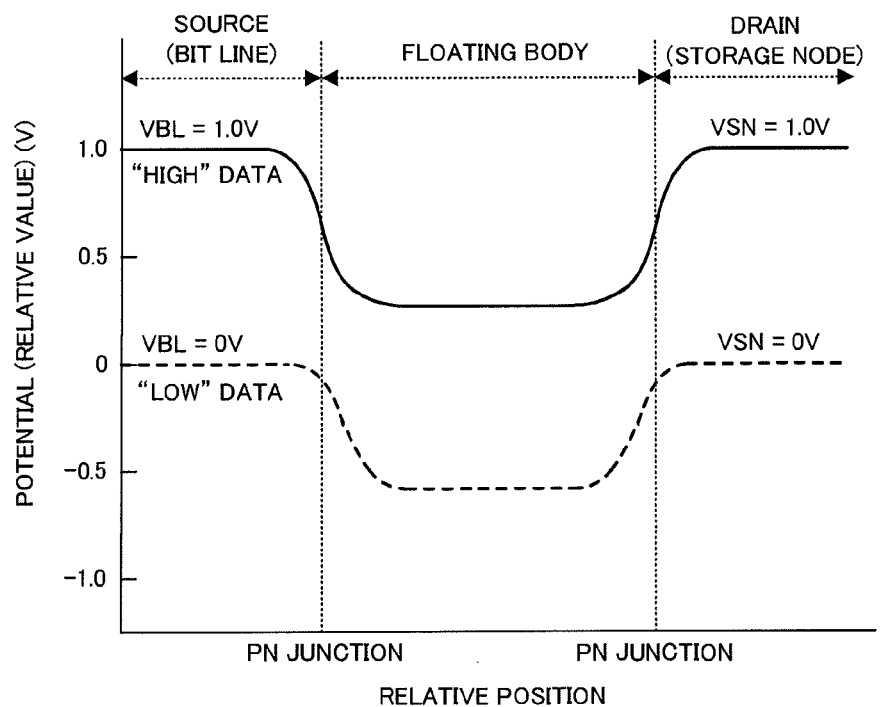
FIG. 5 is a diagram showing a potential state of the select transistor in an OFF state immediately after falling of a word line.
Figure 6:
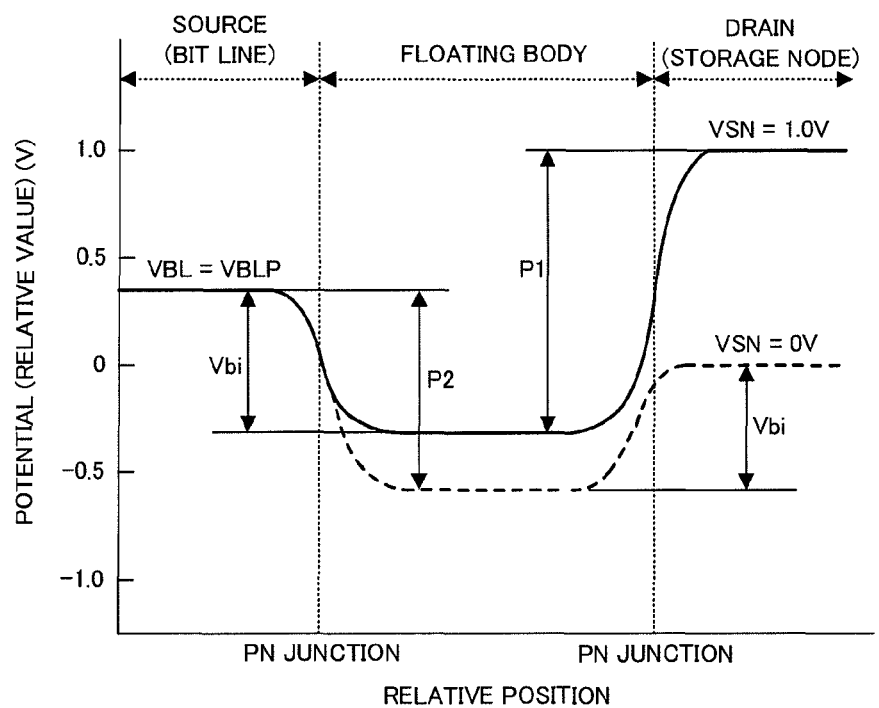
FIG. 6 is a diagram showing a potential state of the select transistor which becomes a thermal equilibrium state when the bit line voltage is set to the precharge voltage.
Figure 7:
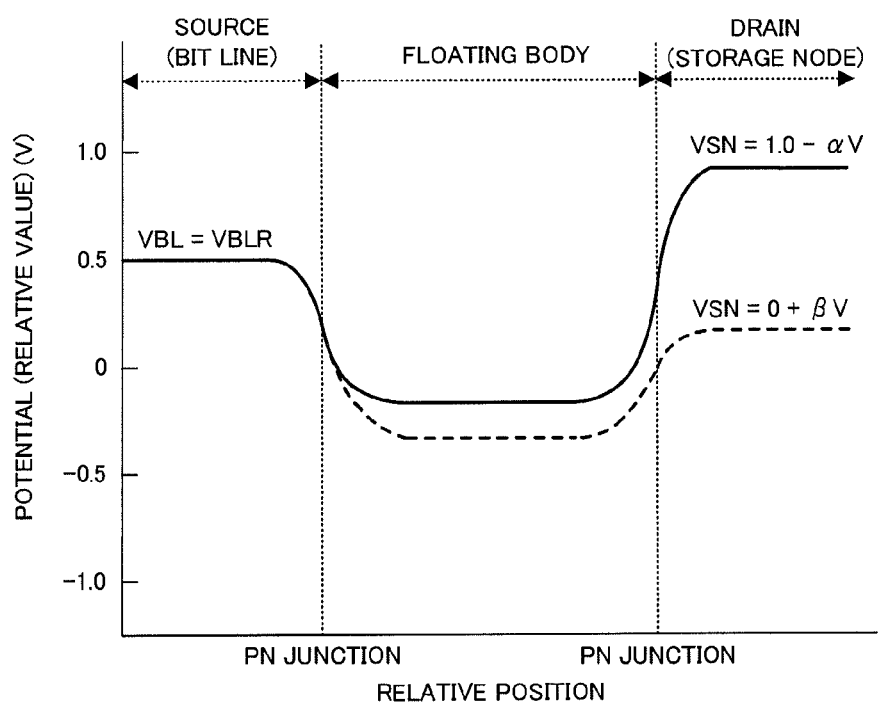
FIG. 7 is a diagram showing a potential state of the select transistor immediately before rising of the word line when starting a read operation.

Next, potential states in the select transistor Q0 of the memory cell MC will be described with reference to FIGS. 5 to 7. FIGS. 5 to 7 show relative positions on a horizontal axis, which corresponds to a path (direction of a dashed arrow in FIG. 2) from the source (bit line BL) to the drain (data storage node SN) through the floating body 24 in the cross sectional structure of FIG. 2, and potentials of the positions are indicated with relative values on a vertical axis. A graph (solid line) in a case where the HIGH data is stored in the memory cell MC and a graph (dash line) in a case where the LOW data is stored in the memory cell MC are respectively shown.

FIG. 5 shows a potential state of the select transistor Q0 in an OFF state immediately after the falling of the word line WL when moving from the restore period T3 to the precharge period T1 in FIG. 4. When writing the HIGH data, the bit line voltage VBL is set, for example, to the power supply voltage VDD. Here, the value of the potential is assumed to be 1V for simplicity, and VBL=VDD=1V is assumed for the source while the voltage VSN at the data storage node SN is assumed to be 1V for the drain. At this point, the potential state of the floating body 24 has become a value determined by receiving coupling when the word line WL falls after rising from the potential of the precharge state. Meanwhile, when writing the LOW data, the bit line voltage VBL is set, for example, to the grand potential VSS. Here, VBL=VSS=0V is assumed for the source while the voltage VSN at the data storage node SN is assumed to be 0V for the drain. At this point, the potential state of the floating body 24 has become a value determined by receiving coupling when the word line WL falls after rising from the potential of the precharge state.

FIG. 6 shows a potential state of the select transistor Q0 which becomes a thermal equilibrium state when the bit line voltage VBL is set to the precharge voltage VBLP during the precharge period T1 of FIG. 4 after the state of FIG. 5. In FIG. 6, since the potential of the source (bit line BL) is relatively lower than that of the drain when the memory cell MC stores the HIGH data, a body potential (the potential of the floating body 24) is a potential lower than the precharge voltage VBLP of the source by a built-in potential Vbi. Here, the built-in potential Vbi is a potential occurring by a depletion layer formed at the PN junction in a zero bias state. For example, when the built-in potential Vbi is set to 0.6V, the voltage VSN is set to 1V and the precharge voltage VBLP is set to 0.3V, respectively, a potential difference P1 occurring at the PN junction of the drain is 1.3V.

Meanwhile, since the potential of the source (bit line BL) is relatively higher than that of the drain when the memory cell MC stores the LOW data, the above body potential is a potential lower than the voltage VSN of the drain by the built-in potential Vbi. For example, when the built-in potential Vbi is set to 0.6V, the voltage VSN is set to 0V and the precharge voltage VBLP is set to 0.3V, respectively, a potential difference P2 occurring at the PN junction of the source is 0.9V.

Here, the potential states of FIGS. 5 and 6 will be compared with the potential state (FIGS. 15 and 16) of the conventional type memory cell. As described above, the potential difference P1=1.3V in FIG. 6 which is obtained when the memory cell MC stores the HIGH data is lower than the potential difference of 2.1V obtained in FIG. 15, and is lower than the potential difference of 1.6V obtained in FIG. 16. Thus, if both impurity densities at the PN junction are the same, the electric field intensity applied to the PN junction is reduced so that the leak current from the data storage node SN of the memory cell MC is reduced, thereby prolonging the data retention time of the HIGH data. Similarly, the potential difference P2=0.9V in FIG. 6 which is obtained when the memory cell MC stores the LOW data is lower than the potential difference of 2.1V obtained in FIG. 15, and is lower than the potential difference of 1.6V obtained in FIG. 16. Thus, if both impurity densities at the PN junction are the same, the electric field intensity applied to the PN junction is reduced so that the leak current flowing to the data storage node SN of the memory cell MC is reduced, thereby prolonging the data retention time of the LOW data.

Next, FIG. 7 shows a potential state of the select transistor Q0 immediately before the rising of the word line WL when starting the read operation after the data retention operation during the precharge period T1 is finished. The bit line voltage VBL at the source is set to the reference voltage VBLR via the transistor Q3 of FIG. 3. The reference voltage VBLR needs to be set to a value as an operating point for allowing the sense amplifier 30 to properly sense and amplify the signal, and in the example of FIG. 7, VBLR=0.5V is set as an intermediate voltage between VSN=0V and VSN=1V. Further, in comparison with FIGS. 5 and 6, the voltage VSN at the data storage node SN of the drain is decreased by $\alpha V$ (VSN=$(1-\alpha)$V) when storing the HIGH data (solid line) and is increased by $\beta V$ (VSN=$(0+\beta)$V) when storing the LOW data (dash line), respectively, caused by the leak current in the data retention operation In the select transistor of the memory cell in the DRAM, impurity densities at the PN junction of the source and at the PN junction of the drain are generally different from each other, and it is not necessarily the case that the leak current in the data retention operation is minimized when the precharge voltage VBLP of the bit line BL is set to the reference voltage VBLR. Therefore, by setting the precharge voltage VBLP differently, the leak current in the data retention operation can be minimized, as described above. In many cases, the impurity density at the PN junction of the source (bit line) is higher than the impurity density at the PN junction of the drain (data storage node SN), and in these cases, the precharge voltage VBLP is set lower than the reference voltage VBLR.

The precharge voltage VBLP (the first potential of the invention) set in the above manner leads to actions in the following manner. The first leak current value at the first PN junction formed between the source region and the floating body 24 when the memory cell MC stores data "0" using the first potential, and the second leak current value at the second PN junction formed between the drain region and the floating body 24 when the memory cell MC stores data "1" using the first potential, are both smaller than a larger one of the third leak current value at the first PN junction when the memory cell MC stores the data "0" using the reference voltage VBLR (the second potential of the invention), and the fourth leak current value at the second PN junction when the memory cell MC stores the data "1" using the second potential. Further, the first potential for the first leak current is approximately equal to that for the second leak current.

Figure 15:
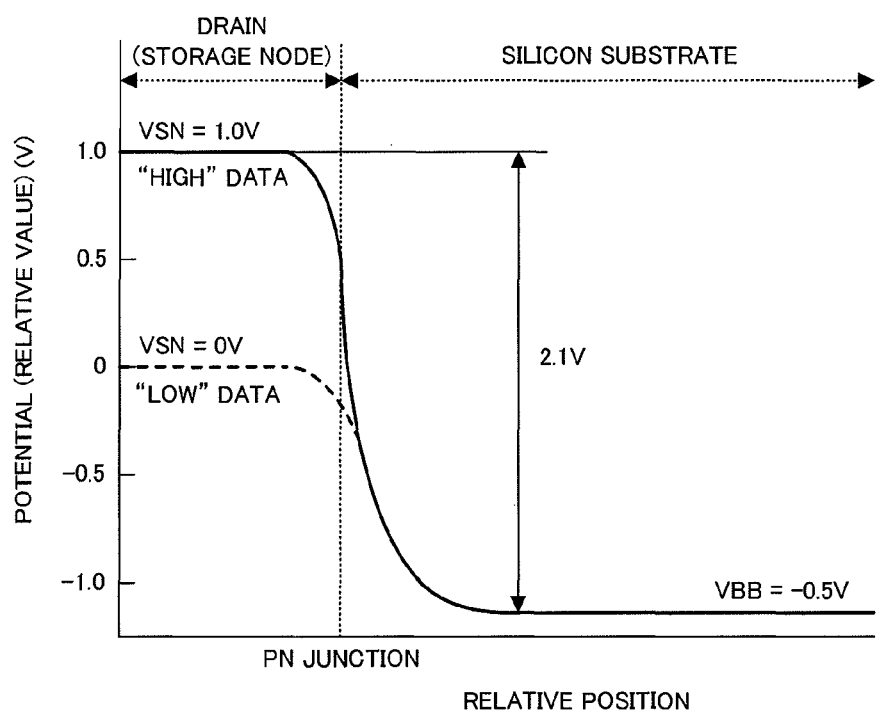
FIG. 15 is a diagram showing a first potential state in the conventional memory cell.
Figure 16:
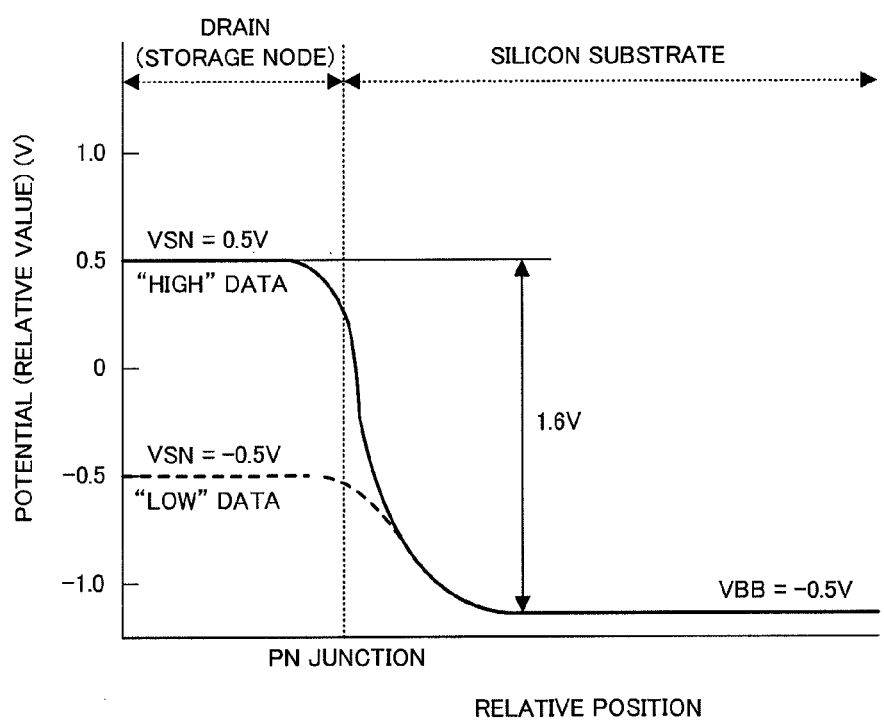
FIG. 16 is a diagram showing a second potential state in the conventional memory cell.

In other words, the precharge voltage VBLP (the first potential of the invention) set in the above manner leads to actions in the following manner. The first electric field intensity at the first PN junction formed between the source region and the floating body 24 using the first potential, and the second electric field intensity at the second PN junction formed between the drain region and the floating body 24 using the first potential, are both smaller than a larger one of a third electric field intensity at the first PN junction using the reference voltage VBLR (the second potential of the invention), and a fourth electric field intensity at the second PN junction using the second potential. Further, each of the first and second electric field intensities has a predetermined value lower than that of the electric field intensity in the two comparison examples (FIGS. 15 and 16).

As described above, by employing the structure of the embodiment, the potential of the floating body 24 of the select transistor Q0 can be appropriately controlled, and thereby the electric field intensities at the PN junctions can be respectively reduced even when the memory cell MC stores the HIGH or LOW data. Then, the precharge voltage VBLP is set so as to optimize the potential difference of the PN junction during the precharge period T1, and thereafter the reference voltage VBLR is set so as to determine the operating point of the sense amplifier 30 before the select transistor Q0 is turned ON. Thereby, the leak current of the memory cell MC can be reduced without hindering a normal amplifying operation of the sense amplifier 30. Thus, the data retention time of the memory cell MC can be prolonged, and a refresh operation can be performed with a long refresh interval, thereby sufficiently reducing an average consumption current of the DRAM.

Figure 8:
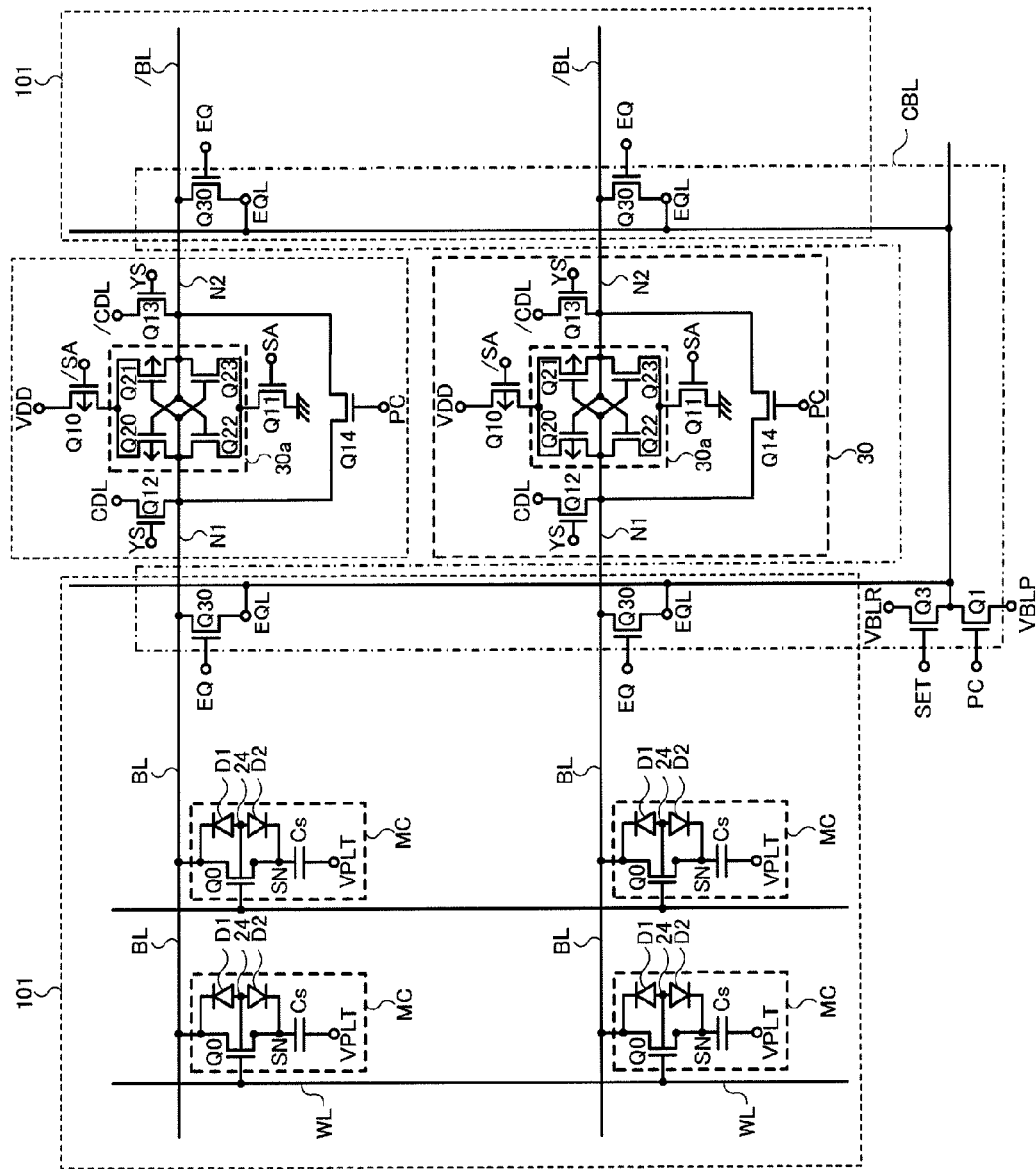
FIG. 8 is a diagram showing a first modification of the partial circuit configuration of the memory cell array of FIG. 3.

In the embodiment, there are various modifications without being limited to the configuration and operation described based on FIGS. 1 to 7. FIG. 8 shows a first modification of the partial circuit configuration of the memory cell array 10 of FIG. 3. The first modification shown in FIG. 8 differs from the circuit configuration of FIG. 3 as described below. In the first modification of FIG. 8, there are provided a plurality of transistors Q30 (the third transistors) which are controlled by a control signal EQ and connected between the respective bit lines BL, /BL and an equalizing line EQL, instead of providing the plurality of the transistors Q1, Q2 (the first potential setting circuit of the invention) and Q3, Q4 (the second potential setting circuit of the invention) respectively connected to the plurality of the complementary bit line pair BL and /BL in FIG. 3. The equalizing line EQL is supplied with a potential from the plurality of the transistors Q1 and Q3. That is, the transistors Q1 and Q3 are arranged in units of activated memory mats 101. The transistors Q1, Q3 and Q30 form the bit line control circuit CBL. In addition, the transistors Q1 and Q3 may be arranged corresponding to each of two memory mats 101. By this arrangement, it is possible to achieve a small memory mat 101 with a sense amplifier row corresponding to a bit line pitch of the strictest condition of line and space. Other parts in FIG. 8 are the same as in FIG. 3, so description thereof will be omitted.

Figure 9:
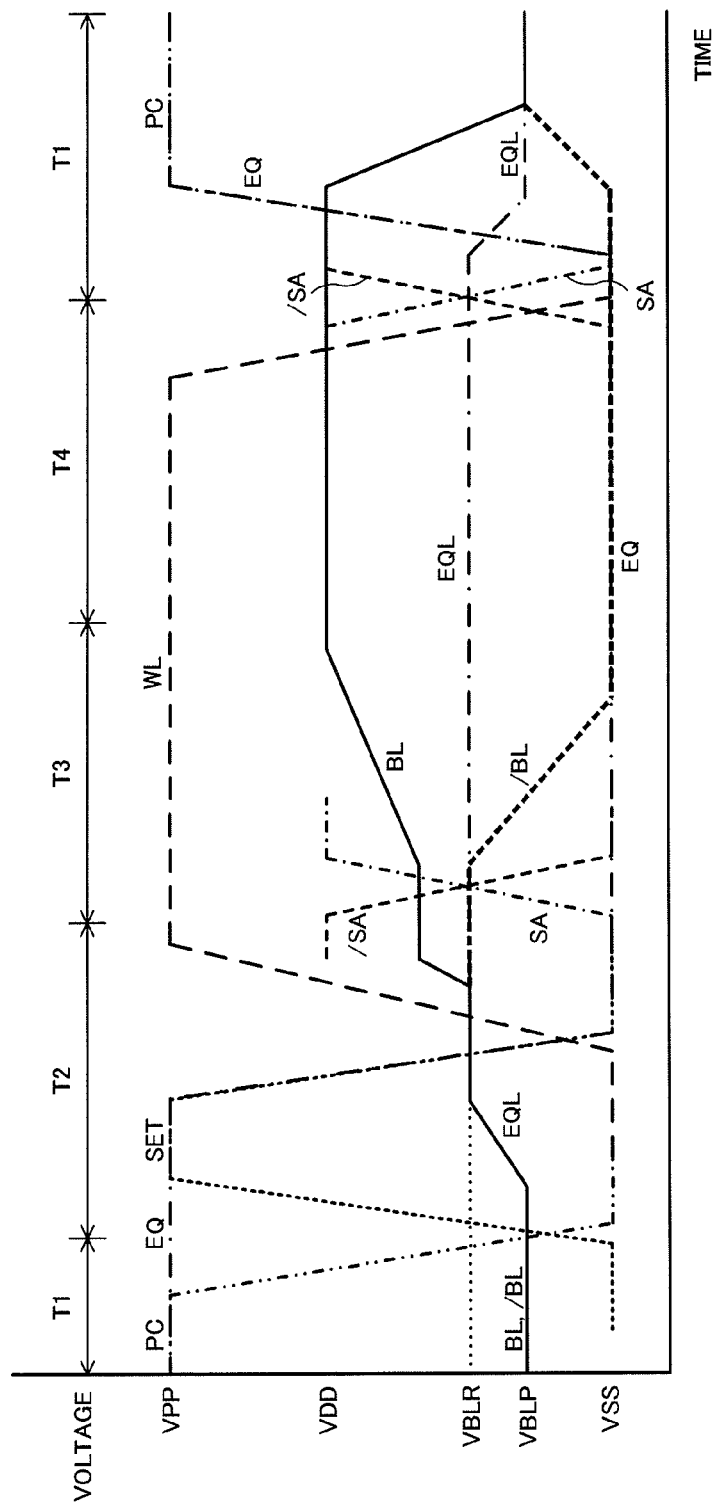
FIG. 9 is a diagram showing operation waveforms corresponding to a read operation and a restore operation for the memory cell in the first modification of FIG. 8.

FIG. 9 shows operation waveforms corresponding to a read operation and a restore operation for the memory cell MC in the first modification of FIG. 8. In the first modification, the control signal EQ is a signal of a logical sum (OR) of the control signal PC and the control signal SET. The equalizing line EQL is controlled to be the precharge voltage VBLP and the reference voltage VBLR corresponding to the control signal PC and the control signal SET, respectively. Other functions are the same as in FIG. 4, so description thereof will be omitted.

Figure 10:
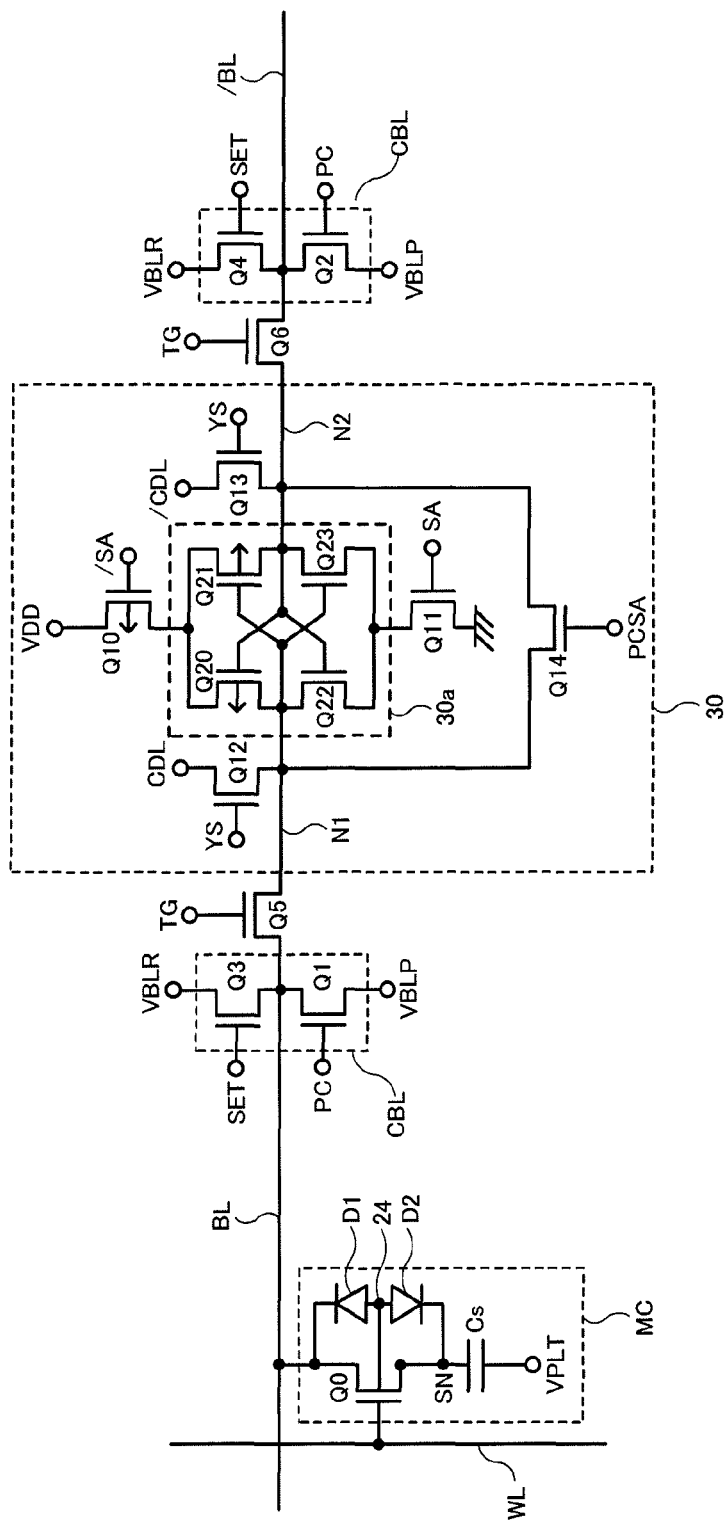
FIG. 10 is a diagram showing a second modification of the partial circuit configuration of the memory cell array of FIG. 3.

FIG. 10 shows a second modification of the partial circuit configuration of the memory cell array 10 of FIG. 3. The second modification shown in FIG. 10 is provided with two NMOS type transistors Q5 and Q6 (the switch circuit of the invention) controlling connection between the complementary bit line pair BL and /BL and the sense amplifier 30, in addition to the same circuit configuration as in FIG. 3. The transistor Q5 is inserted between one bit line BL and the node N1, and the transistor Q6 is inserted between the other bit line /BL and the node N2. A control signal TG is applied to each gate of the transistors Q5 and Q6. A precharge signal PCSA (the second precharge signal) is applied to the gate of the transistor Q14 (the fourth transistor) instead of the precharge signal PC. In addition, other parts in FIG. 10 are the same as in FIG. 3, so description thereof will be omitted.

Figure 11:
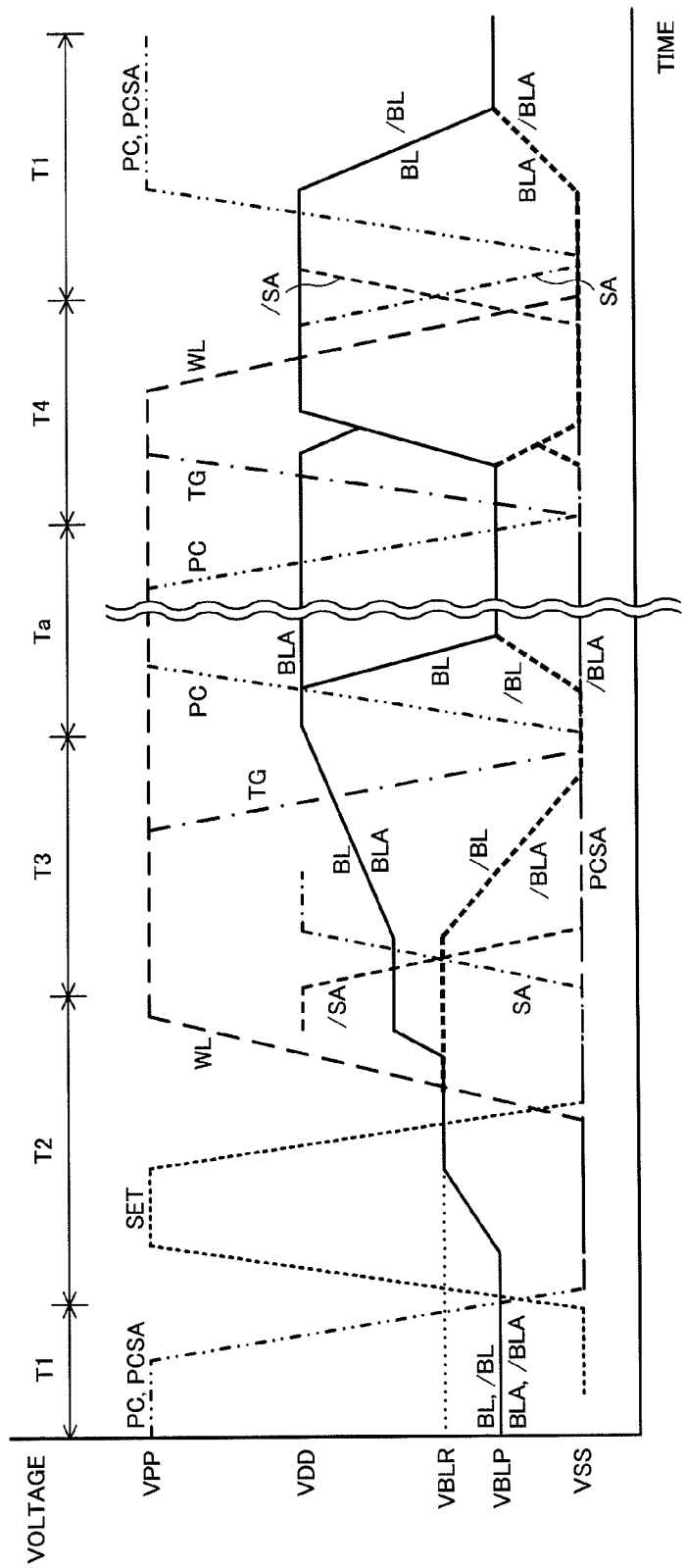
FIG. 11 is a diagram showing operation waveforms corresponding to a read operation and a restore operation for the memory cell in the second modification of FIG. 10.

FIG. 11 shows operation waveforms corresponding to a read operation and a restore operation for the memory cell MC in the second modification of FIG. 10. The second modification has a configuration to reduce the leak current of the memory cell MC when the data retention time is prolonged in a state where the sensing of the sense amplifier 30 has been performed. For example, when a page is left open for as long a time as possible in the operation of the DRAM based on open page policy, or when the same page of the DRAM is controlled to open and close repeatedly, it is desired to employ the operation control of the second modification. Here, page open state means a state where a plurality of the select signals YS corresponding to a plurality of sense amplifiers 30 are activated to allow a sequential access.

In FIG. 11, operation waveforms from the precharge period T1 to the end of the sensing period T3 are the same as in FIG. 4, except that the precharge signal PCSA is controlled to be LOW and HIGH simultaneously with the precharge signal PC, so description thereof will be omitted. In FIG. 11, it is different from FIG. 4 in that an open page period Ta (the first state) is inserted after the end of the sensing period T3. When the open page policy is adopted, this state is kept as long as possible during the open page period Ta, and thereby it is possible to achieve fast access time when an access hits the open page during this period. Specifically, the control signal TG is changed to LOW at the end of the sensing period T3, and the above transistors Q5 and Q6 are turned OFF so that the complementary bit line pair BL and /BL are disconnected from the sense amplifier 30. Subsequently, when moving to the open page period Ta, the precharge signal PC is changed to HIGH, and the complementary bit line pair BL and /BL is precharged to the precharge voltage VBLP. At this point, the precharge signal PCSA is maintained at LOW, and thus the complementary bit line pair BLA and /BLA in the sense amplifier 30 (nodes N1 and N2) is maintained in the amplified state. During the open page period Ta, data is read out to the outside from the complementary bit line pair BLA and /BLA in the sense amplifier 30, and external data is transmitted to the complementary bit line pair BLA and /BLA in the sense amplifier 30.

Next, the precharge signal PC is changed to LOW at the end of the open page period Ta. Thereafter, when moving to the restore period (write period) T4, the control signal TG is changed to HIGH, and the above transistors Q5 and Q6 are turned ON so that the complementary bit line pair BL and /BL are connected to the same in the sense amplifier 30 (nodes N1 and N2). Thereby, the data latched in the sense amplifier 30 is written to the memory cell MC through the complementary bit line pair BL and /BL. Here, since the potentials of the complementary bit line pair BL and /BL have been set to the precharge voltage VBLP during the open page period Ta, similarly as during the precharge period T1, the leak current occurring in the memory cell MC during the open page period Ta can be reduced to the same level as during the precharge period T1. Accordingly, when the DRAM operates in the open page policy, or when the same page of the DRAM is controlled to open and close repeatedly, it is possible to prolong the data retention time. Specifically, the data retention time can be prolonged for a plurality of other memory cells for which the word line WL corresponding to the bit line BL to be accessed is not activated and a plurality of other memory cells for which the word line WL corresponding to the bit line /BL is not activated.

In the operation waveforms of FIG. 11, the control signal TG is changed to LOW after the end of the sensing period T3, and subsequently the precharge signal PC is changed to HIGH. However, this control may be performed even before the sensing of the sense amplifier 30, after the signal is read out to the bit line BL by raising the word line WL. In this case, the potentials of the complementary bit line pair BL and /BL can be set to the precharge voltage VBLP again before being amplified to the power supply voltage VDD and the grand potential VSS, thereby achieving an effect of reducing the consumption current.

Figure 12A:
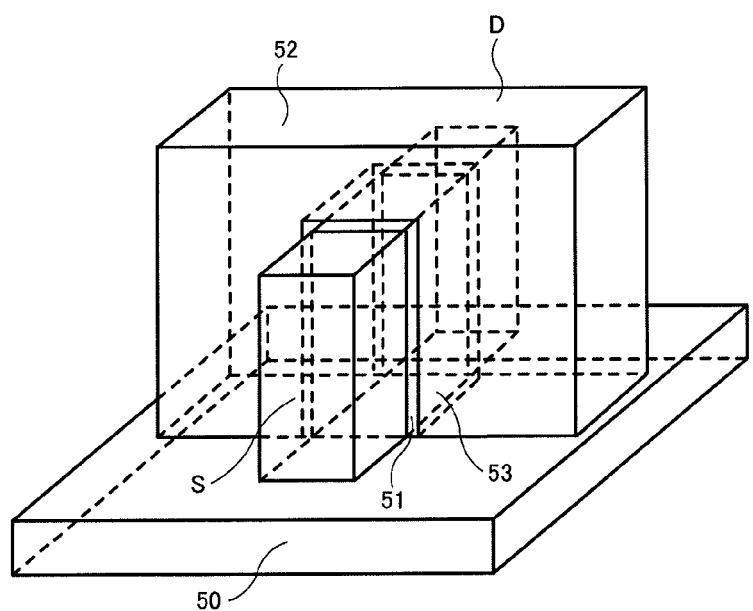
FIGS. 12A and 12B are diagrams showing modifications of a floating body type select transistor used in the embodiment.
Figure 12B:
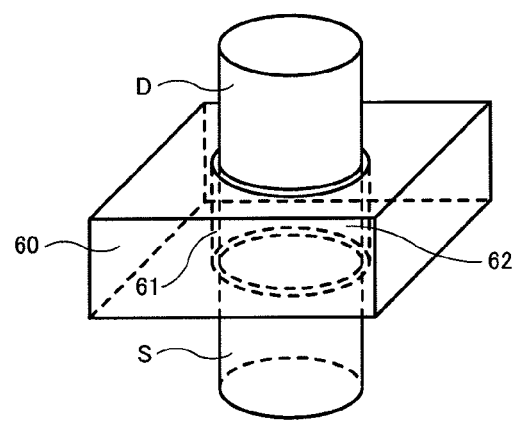

Further, FIGS. 12A and 12B show modifications of the floating body type select transistor used in the embodiment. FIG. 12A shows a structural diagram of a MOS transistor with a Fin structure. In FIG. 12A, a Fin having a source S and a drain D is provided on an insulating film 50, a gate electrode 52 is formed around the Fin via a gate dielectric film 51, and a floating body 53 is formed in a region between the source S and drain D. There are provided two or more channel layers (inversion channel) formed between the source S and drain D, which function as inversion channel regions in a second direction different from a first direction in a horizontal plane of a substrate. Further, FIG. 12B shows a structural diagram of a MOS transistor with a surround gate structure. In FIG. 12B, a gate electrode 60 surrounding a central portion of a pillar-shaped semiconductor region extending in a vertical direction (second direction) different from the horizontal plane (first direction) is formed via a gate dielectric film 61, a source S and a drain D are formed at upper and lower sides of the semiconductor region, and a floating body 62 is formed in a region between the source S and drain D. The MOS transistor with the Fin structure and the MOS transistor with the surround gate structure may be embedded in a silicon substrate or may be formed on the silicon substrate.

When employing the structures of the MOS transistors in the modifications of FIGS. 12A and 12B, the floating bodies 53 and 62 become in a fully depleted state by shrinking them, without being limited thereto. Particularly, by using the MOS transistor with the surround gate structure as shown in FIG. 12B as the select transistor Q0, an area of the memory cell MC can be shrunk to 4F2 (F is a minimum processing dimension), thereby achieving a great effect of reducing a chip area of the DRAM.

Figure 13:
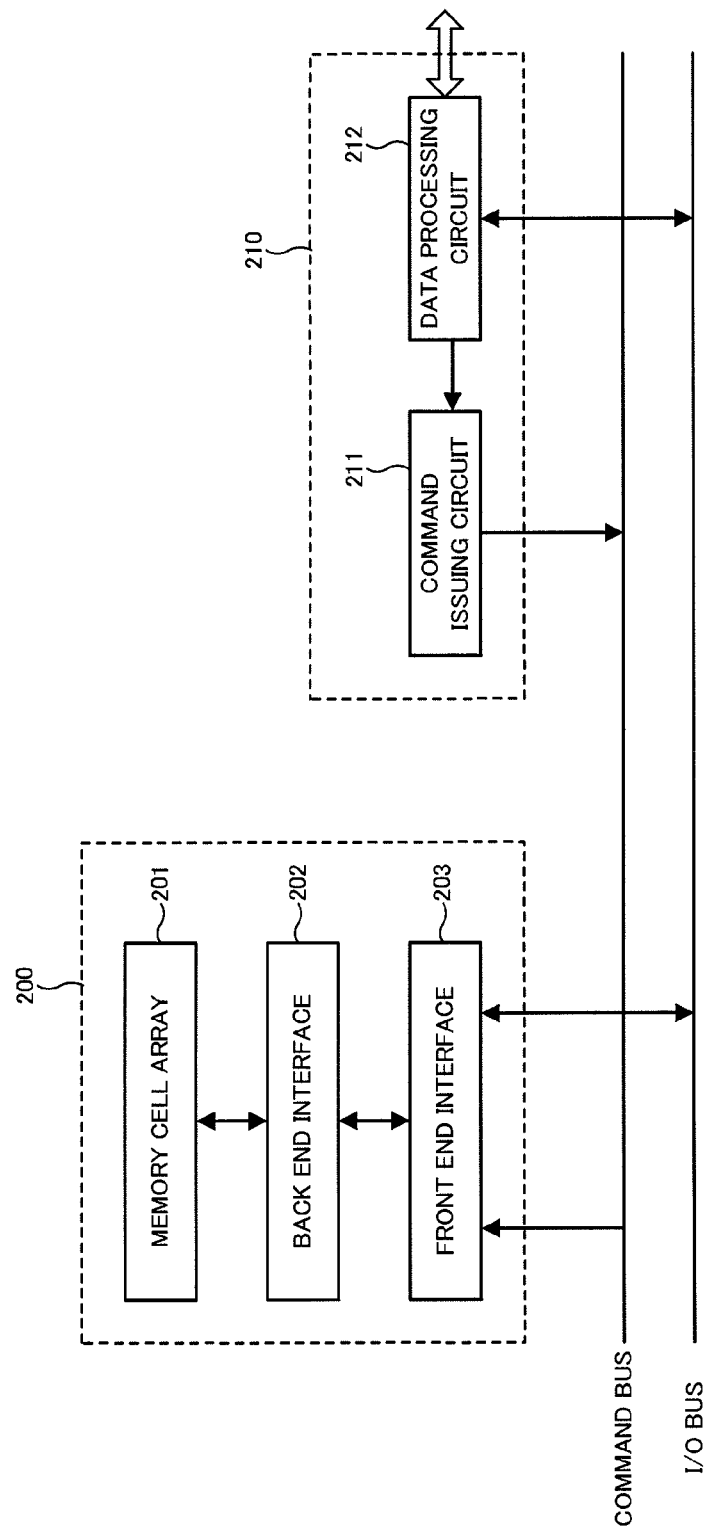
FIG. 13 is a diagram showing a configuration example of a data processing system comprising a semiconductor device having the configuration described in the embodiment and a controller controlling operations of the semiconductor device.
Figure 14:
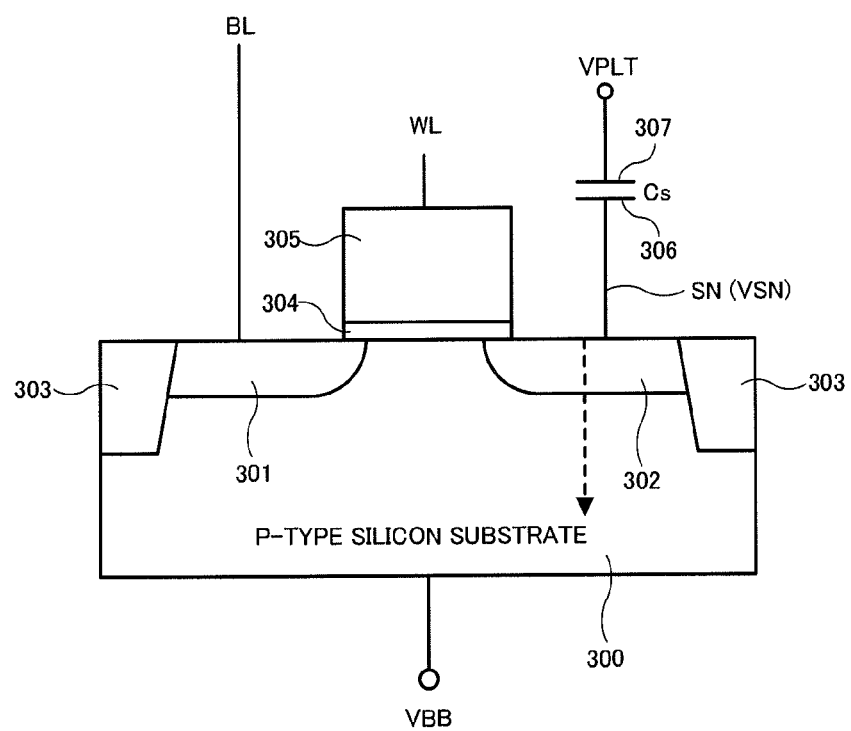
FIG. 14 is a schematic cross sectional view of a conventional memory cell using a select transistor with a bulk type MOS structure.

Next, a case in which the present invention is applied to a system comprising a semiconductor device will be described. FIG. 13 shows a configuration example of a data processing system comprising a semiconductor device 200 having the configuration described in the embodiment and a controller 210 controlling operations of the semiconductor device 200.

The semiconductor device 200 is provided with a memory cell array 201, a back-end interface 202 and a front-end interface 203. A large number of memory cells of the embodiment are arranged in the memory cell array 201. The back-end interface 202 includes the sense amplifiers 30 and peripheral circuits thereof in the embodiment. The front-end interface 203 has a function to communicate with the controller 210 through a command bus and an I/O bus. Although FIG. 13 shows one semiconductor device 200, a plurality of semiconductor devices 200 can be provided in the system.

The controller 210 is provided with a command issuing circuit 211 and a data processing circuit 212, and controls operations of the system as a whole and the operation of the semiconductor device 200. The controller 210 is connected with the command bus and the I/O bus, and additionally has an interface for external connection. The command issuing circuit 211 sends commands to the semiconductor device 200 through the command bus. The data processing circuit 212 sends and receives data to and from the semiconductor device 200 through the I/O bus and performs processes required for the controlling. In addition, the semiconductor device of the embodiment may be included in the controller 210 in FIG. 13.

The data processing system of FIG. 13 is, for example, a system implemented in electronics devices such as personal computers, communication electronics devices, mobile electronics devices and other industrial/consumer electronics devices.

In the foregoing, the preferred embodiments of the present invention have been described. However the present invention is not limited to the above embodiments and can variously be modified without departing the essentials of the present invention, and the present invention obviously covers the various modifications. That is, the present invention covers the various modifications which those skilled in the art can carry out in accordance with all disclosures including claims and technical ideas.

For example, although the configuration in which the ground potential VSS is used as the reference voltage has been described in the embodiments, the present invention can be applied to a configuration in which the voltage relation is reversed so as to use the supply voltage VDD as the reference voltage. In this case, N-channel type transistors included in the circuit configuration (FIG. 3) of the embodiments may be replaced with P-channel type transistors or the like. Further, various circuit configurations can be employed for the sense amplifier 30 and the like, without being limited to the configurations described in the embodiments. For example, a folded bit line structure or a hierarchical single-ended bit line structure can be employed to configure the bit lines BL and the sense amplifiers 30, in addition to an open bit line structure.

Further, various materials and structures can be adapted to form a field effect transistor (FET) used as the select transistor of the embodiments. For example, various types such as MIS (Metal-Insulator Semiconductor), TFT (Thin Film Transistor), and the like can be used as the FET for the select transistor, in addition to MOS (Metal Oxide Semiconductor) transistor, and transistors other than FETs can be used for other transistors. Further, an N-channel type transistor (NMOS transistors) is a typical example of a first conductive type transistor, and a P-channel type transistor (PMOS transistor) is a typical example of a second conductive type transistor. Furthermore, an N-TYPE semiconductor substrate can be used other than a P-type semiconductor substrate, and also a semiconductor substrate having SOI (Silicon on Insulator) structure or other type semiconductor substrates can be used.

The present invention is not limited to the DRAM, and can be applied to various semiconductor devices including memory functions such as CPU (Central Processing Unit), MCU (Micro Control Unit), DSP (Digital Signal Processor), ASIC (Application Specific Integrated Circuit), ASSP (Application Specific Standard Product) and the like.

The invention claimed is:

1. A semiconductor device comprising:
   a memory cell including a capacitor storing data as a charge and a select transistor including a first region formed among source and drain regions and an insulating layer to electrically separate the first region from a substrate, the select transistor coupled between a bit line and the capacitor;
   a bit line control circuit including a first transistor coupled between the bit line and a first node and a second transistor coupled between the bit line and a second node different from the first node; and
   a latch circuit amplifying a signal read out from the memory cell through the bit line to a first logic level or a second logic level based on the signal.

2. The semiconductor device according to claim 1, wherein the select transistor comprises a field effect transistor including an SOI structure in which the insulating layer is formed between the first region and the substrate.

3. The semiconductor device according to claim 1, wherein the select transistor comprises a field effect transistor including a Fin structure, the first region includes a channel layer formed in a second direction different from a first direction in a horizontal plane of the substrate.

4. The semiconductor device according to claim 3, wherein the insulating layer is formed between the first region and the substrate.

5. The semiconductor device according to claim 3, wherein the channel layer comprises a first channel region including a first surface facing to a gate electrode of the select transistor and a second channel region including a second surface facing to the gate electrode of the select transistor, a facing direction of the first surface is opposite to a facing direction of the second surface.

6. The semiconductor device according to claim 5, wherein the channel layer comprises a third channel region coupled between the first and second channel regions, the third channel region includes a third surface facing to the gate electrode of the select transistor, a facing direction of the third surface is opposite to a facing direction of the insulating layer.

7. The semiconductor device according to claim 1, wherein the select transistor comprises a field effect transistor including a surround gate structure and a pillar-shaped semiconductor region, the pillar-shaped semiconductor region includes a source and a drain formed in a second direction different from a first direction in a horizontal plane of the substrate, the source and the drain being formed at upper and lower sides of the semiconductor region and the first region being formed in a region between the source and the drain.

8. The semiconductor device according to claim 7, wherein the select transistor includes a gate electrode surrounding whole surface of the first region via a gate insulating layer to control an impedance between the source and the drain, the gate insulating layer formed in a cylindrical shape.

9. The semiconductor device according to claim 3, wherein the first transistor includes a control terminal coupled to a third node, and the second transistor includes a control terminal coupled to a fourth node different from the third node.

10. The semiconductor device according to claim 9, wherein the first node is capable to supply a first potential and the second node is capable to supply a second potential, each voltage value of the first potential and the second potential is intermediate between the first and the second logic levels.

11. The semiconductor device according to claim 3, wherein the latch circuit includes a first transistor coupled between a first node and a second node, the first transistor including a gate coupled to the bit line, a second transistor coupled between the second node and a third node, the second transistor including a gate coupled to the bit line, a third transistor coupled between the first node and the bit line, the third transistor including a gate coupled to the second node, and a fourth transistor coupled between the bit line and the third node, the fourth transistor including a gate coupled to the second node.

12. The semiconductor device according to claim 11, further comprising a column switching transistor coupled between the bit line and a data line including a control terminal receiving a select signal to transfer a data of the bit line to the data line or transfer a data of the data line to the bit line.

13. The semiconductor device according to claim 3, wherein the select transistor is coupled between the bit line and a storage electrode of the capacitor, and includes a control terminal coupled to a word line.

14. The semiconductor device according to claim 7, wherein the first transistor includes a control terminal coupled to a third node, and the second transistor includes a control terminal coupled to a fourth node different from the third node.

15. The semiconductor device according to claim 14, wherein the first node is capable to supply a first potential and the second node is capable to supply a second potential, each voltage value of the first potential and the second potential is intermediate between the first and the second logic levels.

16. The semiconductor device according to claim 7, wherein the latch circuit includes a first transistor coupled between a first node and a second node, the first transistor including a gate coupled to the bit line, a second transistor coupled between the second node and a third node, the second transistor including a gate coupled to the bit line, a third transistor coupled between the first node and the bit line, the third transistor including a gate coupled to the second node, and a fourth transistor coupled between the bit line and the third node, the fourth transistor including a gate coupled to the second node.

17. The semiconductor device according to claim 16, further comprising a column switching transistor coupled between the bit line and a data line including a control terminal receiving a select signal to transfer a data of the bit line to the data line or transfer a data of the data line to the bit line.

18. The semiconductor device according to claim 7, wherein the select transistor is coupled between the bit line and a storage electrode of the capacitor, and includes a control terminal coupled to a word line.

19. The semiconductor device according to claim 2, wherein the first transistor includes a control terminal coupled to a third node, and the second transistor includes a control terminal coupled to a fourth node different from the third node.

20. The semiconductor device according to claim 19, wherein the first node is capable to supply a first potential and the second node is capable to supply a second potential, each voltage value of the first potential and the second potential is intermediate between the first and the second logic levels.

21. The semiconductor device according to claim 2, wherein the latch circuit includes a first transistor coupled between a first node and a second node, the first transistor including a gate coupled to the bit line, a second transistor coupled between the second node and a third node, the second transistor including a gate coupled to the bit line, a third transistor coupled between the first node and the bit line, the third transistor including a gate coupled to the second node, and a fourth transistor coupled between the bit line and the third node, the fourth transistor including a gate coupled to the second node.

22. The semiconductor device according to claim 21, further comprising a column switching transistor coupled between the bit line and a data line including a control terminal receiving a select signal to transfer a data of the bit line to the data line or transfer a data of the data line to the bit line.

23. The semiconductor device according to claim 2, wherein the select transistor is coupled between the bit line and a storage electrode of the capacitor, and includes a control terminal coupled to a word line.

24. The semiconductor device according to claim 7, wherein the field effect transistor including the surround gate structure is embedded in the substrate.

* * * * *